US012756159B2

(12) United States Patent
Cheng

(10) Patent No.: US 12,756,159 B2
(45) Date of Patent: Oct. 6, 2026

(54) MANUFACTURING METHOD OF VERTICAL CAVITY SURFACE EMITTING LASER

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 698 days.

(21) Appl. No.: 18/249,048

(22) PCT Filed: Nov. 23, 2020

(86) PCT No.: PCT/CN2020/130801
§ 371 (c)(1),
(2) Date: Apr. 13, 2023

(87) PCT Pub. No.: WO2022/104770
PCT Pub. Date: May 27, 2022

(65) Prior Publication Data

US 2023/0396038 A1 Dec. 7, 2023

(51) Int. Cl.

*H01S 5/183* (2006.01)
*H01S 5/02* (2006.01)
*H01S 5/343* (2006.01)

(52) U.S. Cl.

CPC ........ *H01S 5/18369* (2013.01); *H01S 5/0217* (2013.01); *H01S 5/34333* (2013.01)

(58) Field of Classification Search

CPC ........................................... H01S 5/183–18397
See application file for complete search history.

(56) References Cited

U.S. PATENT DOCUMENTS

| | | |
|---|---|---|
| 7,986,722 B2 | 7/2011 | Higuchi et al. |
| 9,036,956 B2 | 5/2015 | Tseng et al. |

(Continued)

FOREIGN PATENT DOCUMENTS

| | | |
|---|---|---|
| CN | 1533005 A | 9/2004 |
| CN | 103257398 A | 8/2013 |

(Continued)

OTHER PUBLICATIONS

English Translation of Zhang (Year: 2013).*

(Continued)

*Primary Examiner* — Minsun O Harvey
(74) *Attorney, Agent, or Firm* — Carroll, Hoette & Butscher, LLC; Christopher R. Carroll

(57) ABSTRACT

A manufacturing method of a vertical cavity surface emitting laser is provided. The vertical cavity surface emitting laser includes a first reflector, a first semiconductor layer, an active layer, a second semiconductor layer, an oxide layer, and a second reflector sequentially stacked. The conductivity type of the first semiconductor layer is opposite to that of the second semiconductor layer. The oxide layer includes a light transmitting region and a light shielding region, and the light shielding region surrounds the light transmitting region. The manufacturing method includes planarizing a (Continued)

first contact surface of the first semiconductor layer and the first reflector, and/or a second contact surface of the second semiconductor layer and the second reflector.

10 Claims, 13 Drawing Sheets

(56) References Cited

U.S. PATENT DOCUMENTS

| | | | | |
|---|---|---|---|---|
| 10,109,984 | B2 | 10/2018 | Kuramoto et al. | |
| 10,700,497 | B2 | 6/2020 | Kuramoto et al. | |
| 2004/0184498 | A1 | 9/2004 | Ueki | |
| 2007/0201526 | A1 * | 8/2007 | Hori | H01S 5/18308 372/98 |
| 2011/0007769 | A1 * | 1/2011 | Masui | H01S 5/18316 372/46.013 |
| 2013/0216177 | A1 | 8/2013 | Tseng et al. | |
| 2014/0087499 | A1 * | 3/2014 | Doan | B82Y 20/00 257/E33.056 |
| 2017/0237234 | A1 * | 8/2017 | Han | H01S 5/34333 372/45.012 |
| 2017/0346258 | A1 | 11/2017 | Kuramoto et al. | |
| 2019/0027900 | A1 | 1/2019 | Kuramoto et al. | |
| 2020/0287351 | A1 | 9/2020 | Gerlach et al. | |
| 2020/0403378 | A1 | 12/2020 | Fujii et al. | |
| 2021/0075193 | A1 * | 3/2021 | Lee | H01S 5/18338 |

FOREIGN PATENT DOCUMENTS

| | | | | |
|---|---|---|---|---|
| CN | 103325894 | A | * | 9/2013 |
| CN | 107078190 | A | | 8/2017 |
| CN | 107112722 | A | | 8/2017 |
| CN | 111448724 | A | | 7/2020 |
| CN | 111670523 | A | | 9/2020 |

OTHER PUBLICATIONS

State Intellectual Property Office of the People's Republic of China, Office Action and Search Report Issued in Application No. 2020801072316, Mar. 22, 2025, 19 pages. (Submitted with Machine Translation).

ISA State Intellectual Property Office of the People's Republic of China, International Search Report Issued in Application No. PCT/CN2020/130801, Apr. 28, 2021, WIPO, 4 pages.

ISA State Intellectual Property Office of the People's Republic of China, Written Opinion of the International Searching Authority Issued in Application No. PCT/CN2020/130801, Apr. 28, 2021, WIPO, 7 pages. (Submitted with Machine/Partial Translation).

* cited by examiner

MANUFACTURING METHOD OF VERTICAL CAVITY SURFACE EMITTING LASER

CROSS-REFERENCE TO RELATED APPLICATIONS

This application is a national phase entry of and claims priority to International Patent Application No. PCT/CN2020/130801 (filed 23 Nov. 2020), the entire disclosure of which is incorporated herein by reference.

TECHNICAL FIELD

The present disclosure relates to the field of semiconductor, and more particular, to a manufacturing method of a vertical cavity surface emitting laser.

BACKGROUND

Group III nitride is the third generation of new semiconductor materials after the first and second generation semiconductor materials such as Si and GaAs. As a wide band gap semiconductor material, GaN has many advantages, such as high saturation drift speed, high breakdown voltage, excellent carrier transport performance. Besides, GaN can be used to form AlGaN, InGaN ternary alloys, and AlInGaN quaternary alloys, and also be easily to manufacture GaN-based PN junctions. In view of this, in recent years, extensive and in-depth researches have conducted on GaN-based materials and semiconductor devices, and the technology growing GaN-based materials with MOCVD (Metal Organic Chemical Vapor Deposition) is becoming more and more mature. In the research on semiconductor devices, significant achievements and developments have been achieved in the field of optoelectronic devices such as GaN-based LEDs, LDs, and in the field of microelectronic devices such as GaN-based HEMTs.

However, in related technologies, the wavelengths of light emitted from optoelectronic devices based on cavity resonators are different at different positions, which means that the uniformity of the emitted light is poor.

In view of this, it is necessary to provide a new method of manufacturing a vertical cavity surface emitting laser so as to solve the above technical problems.

SUMMARY

The object of the present disclosure is to provide a manufacturing method of a vertical cavity surface emitting laser, which can improve the uniformity of light emitted from the vertical cavity surface emitting laser.

In order to achieve the above purpose, in a first aspect of the present disclosure, a manufacturing method of a vertical cavity surface emitting laser is provided, where the vertical cavity surface emitting laser includes a first reflector, a first semiconductor layer, an active layer, a second semiconductor layer, an oxide layer, and a second reflector sequentially stacked; a conductivity type of the first semiconductor layer is opposite to a conductivity type of the second semiconductor layer; the oxide layer includes a light transmitting region and a light shielding region, and the light shielding region surrounds the light transmitting region; the manufacturing method includes: planarizing a first contact surface between the first semiconductor layer and the first reflector, and/or a second contact surface between the second semiconductor layer and the second reflector.

Optionally, the manufacturing method of the vertical cavity surface emitting laser includes:

sequentially forming the first reflector, the first semiconductor layer, the active layer, and the second semiconductor material layer on a substrate;

planarizing a first surface of the second semiconductor material layer away from the substrate to obtain the second semiconductor layer, wherein the first surface after planarization becomes the second contact surface.

Optionally, before sequentially forming the first reflector, the first semiconductor layer, the active layer, and the second semiconductor material layer on the substrate, the method further includes:

sequentially forming a nucleation layer and a buffer layer on the substrate.

Optionally, after planarizing the first surface, away from the substrate, of the second semiconductor material layer to obtain the second semiconductor material layer, the method further includes:

sequentially forming the oxide layer and the second reflector on the second semiconductor layer.

Optionally, the manufacturing method of the vertical cavity surface emitting laser includes:

forming a first reflective material layer on a substrate, wherein the first reflective material layer including one or more first insulating material layers and one or more second insulating material layers arranged in layers;

planarizing a second surface of the first reflective material layer away from the substrate to obtain the first reflector, where the second surface after planarization becomes the first contact surface;

sequentially forming the first semiconductor layer, the active layer, the second semiconductor layer, the oxide layer, and the second reflector on the first reflector.

Optionally, the first reflective material layer includes multiple layers of first insulating material layers and second insulating material layers which are alternately arranged;

before forming the first reflective material layer on the substrate, the method further includes:

sequentially forming a nucleation layer and a buffer layer on the substrate.

Optionally, the manufacturing method of the vertical cavity surface emitting laser includes:

sequentially forming a first semiconductor material layer, the active layer, the second semiconductor layer, the oxide layer, and the second reflector on a substrate;

adhering a support substrate onto the second reflector to obtain an intermediate transition structure;

turning over the intermediate transition structure and removing the substrate to expose a third surface of the first semiconductor material layer;

planarizing the third surface to obtain the first semiconductor layer, wherein the third surface after planarization becomes the first contact surface.

Optionally, before sequentially forming the first semiconductor material layer, the active layer, the second semiconductor layer, the oxide layer, and the second reflector on the substrate, the method further includes:

sequentially forming a nucleation layer and a buffer layer on the substrate;

removing the substrate, includes:

removing the substrate, the nucleation layer, and the buffer layer to expose the third surface.

Optionally, after planarizing the third surface to obtain the first semiconductor layer, the method further includes:

forming the first reflector on the first semiconductor layer.

Optionally, the first semiconductor layer is an N-type semiconductor layer; the second semiconductor layer is a P-type semiconductor layer; and the active layer includes a multiple quantum well structure.

Optionally, 11. The manufacturing method of the vertical cavity surface emitting laser according to claim 10, wherein, the multiple quantum well structure is a periodic structure in which GaN and AlGaN are alternately arranged, or a periodic structure in which GaN and AlInGaN are alternately arranged.

Optionally, a material of the first semiconductor layer includes a group III-V compound, and a material of the second semiconductor layer includes a group III-V compound.

Optionally, the vertical cavity surface emitting laser further includes a third insulating material layer, a fourth insulating material layer, a first electrode, and a second electrode, wherein the third insulating material layer is located on a side of the first reflector away from the second reflector, and the first electrode is located on a side of the third insulating material layer away from the first reflector;

the fourth insulating material layer is located on a side of the second reflector away from the first reflector, and the second electrode is located on the side of the fourth insulating material layer away from the second reflector; and the second electrode contacts the second reflector through a through hole in the fourth insulating material layer.

Optionally, the method further includes:

when the first contact surface is planarized, during the process of planarizing the first contact surface, detecting whether a surface roughness of the first contact surface is within the specified range or not; if the surface roughness is within the specified range, stop planarizing the first contact surface; if the surface roughness is out of the specified range, continue planarizing the first contact surface until the surface roughness is within the specified range;

when the first contact surface is planarized, during the process of planarizing the first contact surface, detecting whether a surface roughness of the first contact surface is within the specified range or not; if the surface roughness is within the specified range, stop planarizing the first contact surface; if the surface roughness is out of the specified range, continue planarizing the first contact surface until the surface roughness is within the specified range.

Figure 1:
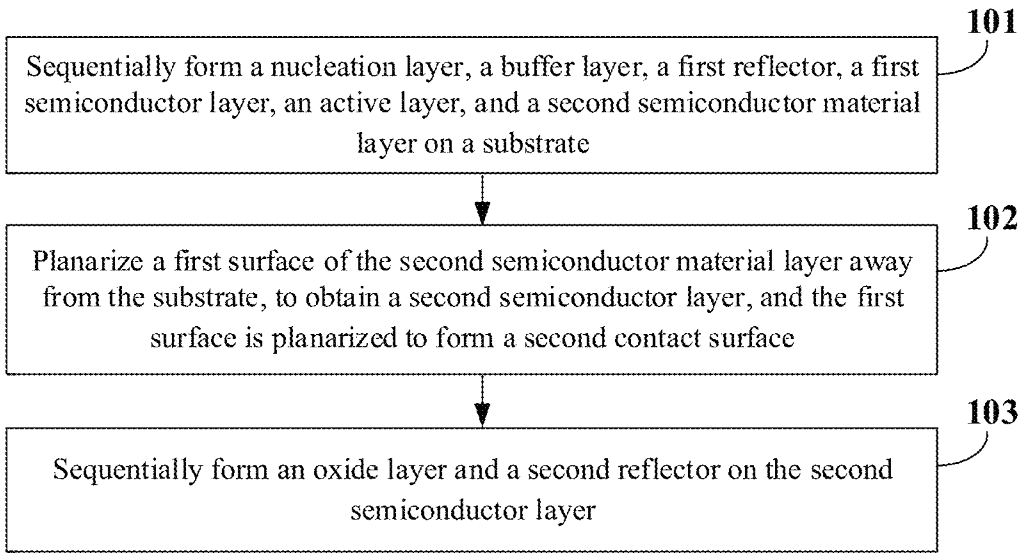
FIG. 1 is a flowchart of a method of manufacturing a vertical cavity surface emitting laser according to a first embodiment of the present disclosure.

To facilitate the understanding of the present disclosure, all reference signs present in the present disclosure are listed below:

substrate 21
buffer layer 22
first reflector 23
first semiconductor layer 24
active layer 25
second semiconductor material layer 26
second semiconductor layer 27
second reflector 28
first semiconductor material layer 29
adhesive layer 210
support substrate 211
intermediate transition structure 212
first surface 213
second contact surface 214
first reflective material layer 215
first insulating material layer 2151
second insulating material layer 2152
second surface 216
first contact surface 217
third surface 218
nucleation layer 219
third insulating material layer 220
fourth insulating material layer 221
first electrode 222
second electrode 223
oxide layer 224
light transmitting region 2241
light shielding region 2242

DETAILED DESCRIPTION OF THE EMBODIMENTS

In order to make the above-mentioned objects, features and advantages of the present disclosure more obvious and understandable, embodiments of the present disclosure will be described in detail below with reference to the accompanying drawings.

Figure 2:
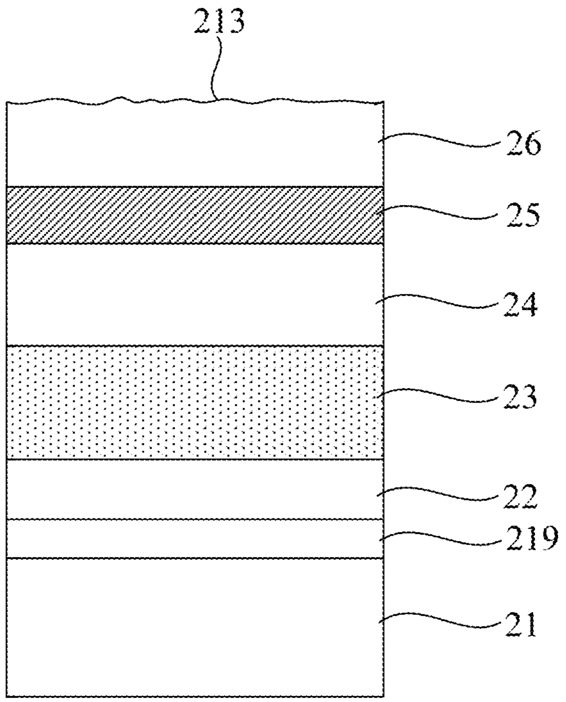
FIGS. 2 to 3 are schematic views illustrating intermediate structures corresponding to the process of FIG. 1.
Figure 3:
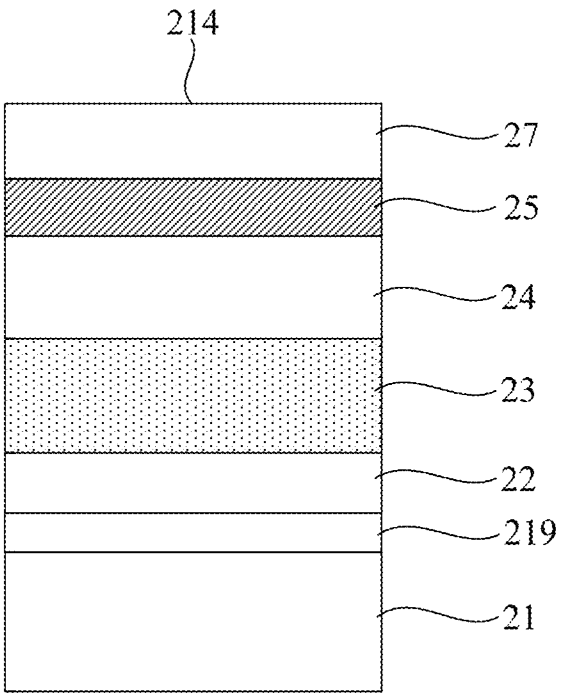
Figure 4:
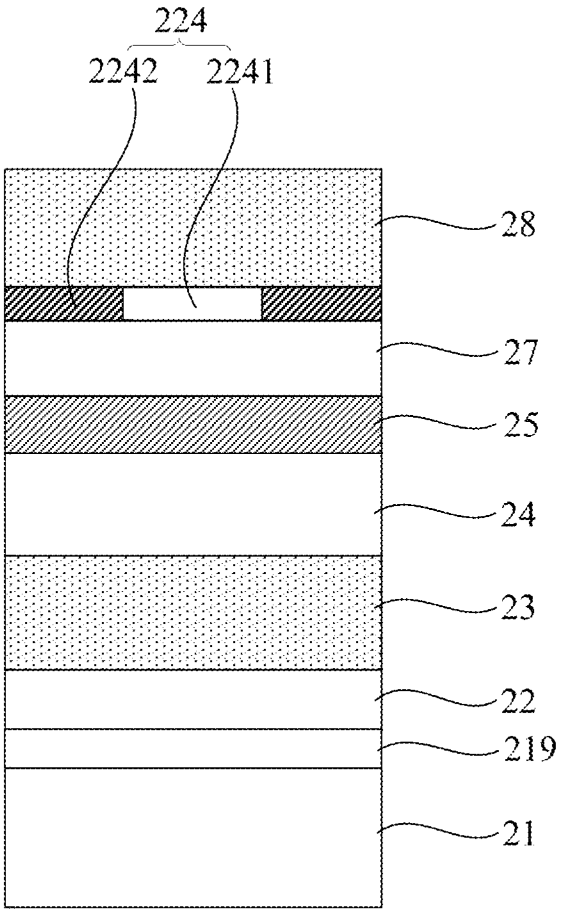
FIG. 4 is a cross-sectional structure diagram of the vertical cavity surface emitting laser according to the first embodiment of the present disclosure.

FIG. 1 is a flowchart of a method of manufacturing a vertical cavity surface emitting laser according to a first embodiment of the present disclosure. FIGS. 2 to 3 are schematic views illustrating intermediate structures corresponding to the process of FIG. 1. FIG. 4 is a cross-sectional structure diagram of the vertical cavity surface emitting laser according to the first embodiment of the present disclosure. As shown in FIG. 1, the manufacturing method of the vertical cavity surface emitting laser includes the following steps 101 to 103.

In step 101, a nucleation layer 219, a buffer layer 22, a first reflector 23, a first semiconductor layer 24, an active layer 25, and a second semiconductor material layer 26 are sequentially formed on the substrate 21.

In this step, as shown in FIG. 2, the nucleation layer 219, the buffer layer 22, the first reflector 23, the first semiconductor layer 24, the active layer 25, and the second semiconductor material layer 26 can be sequentially formed on the substrate 21 via an epitaxial process.

In this embodiment, the material of the substrate 21 includes silicon. Of course, the material of the substrate 21 can also include silicon carbide (SiC), gallium nitride (GaN), or sapphire.

In this embodiment, the material of the nucleation layer 219 can be a group III-V compound, such as AlN, GaN, AlGaN, InGaN, or AlInGaN.

In this embodiment, the material of the buffer layer 22 can be a group III-V compound, such as GaN, AlN, AlGaN, InGaN, or AlInGaN.

In this embodiment, the first reflector 23 is a Bragg reflector, and the first reflector 23 is formed of high refractive index materials and low refractive index materials in which these two kinds of materials are alternately arranged. For example, the first reflector 23 includes $SiO_2$ and $TiO_2$ which are alternately disposed in a plurality of layers, which is not limited here.

In this embodiment, the first semiconductor layer 24 is an N-type semiconductor layer. The material of the first semiconductor layer 24 is a group III-V compound, such as GaN, AlN, AlGaN, InGaN, or AlInGaN. The doping elements of the first semiconductor layer 24 include at least one kind of Si ions, Ge ions, Sn ions, Se ions, or Te ions. For example, the doping elements of the first semiconductor layer 24 include Si ions, or include Si ions and Ge ions, which is not limited here.

In this embodiment, the active layer 25 includes a multiple quantum well structure. Where, the multiple quantum well structure can be a periodic structure in which GaN and AlGaN are alternately arranged, or a periodic structure in which GaN and AlInGaN are alternately arranged, which is not limited here.

In this embodiment, the second semiconductor material layer 26 is a P-type conductive material layer, and the material of the second semiconductor material layer 26 is a group III-V compound, for example, GaN, AlN, AlGaN, InGaN, or AlInGaN. The doping elements of the second semiconductor material layer 26 include at least one kind of Mg ions, Zn ions, Ca ions, Sr ions, or Ba ions, for example, including Mg ions, or including Zn ions and Ca ions, which is not limited here.

It should be noted that, as shown in FIG. 2, the first surface 213, far away from the substrate 21, of the second semiconductor material layer 26 may be uneven. If a second reflector 28 is directly grown on the first surface 213, it may cause the surface of the second reflector 28 facing the first reflector 23 to be uneven, and may cause the thickness uniformity of the epitaxial layers between the second reflector 28 and the first reflector 23 to be poor, further resulting in different cavity lengths of the cavity resonator at different locations, in other words, the uniformity of the cavity length of the cavity resonator is poor, which makes a poor uniformity of the light emitted from the vertical cavity surface emitting laser.

T represents the cavity length of the resonator, λ represents the wavelength of the light emitted by the vertical cavity surface emitting laser. The relationship between T and λ is as follows:

$$\lambda=2nT/N;$$

where, N is a positive integer.

In step 102, a first surface 213 of the second semiconductor material layer 26 away from the substrate 21 is planarized to obtain a second semiconductor layer 27, and the first surface 213 is planarized to form a second contact surface 214.

In this embodiment, as shown in FIG. 3, the first surface 213 of the second semiconductor material layer 26 away from the substrate 21 can be planarized by using a dry etching process, a wet etching process, or a mechanical polishing process to obtain the second semiconductor layer 27, where the first surface 213 after planarization becomes the second contact surface 214.

In this embodiment, during the process of planarizing the first surface 213, whether the surface roughness of the first surface 213 is within the specified range or not is detected. If the surface roughness is within the specified range, stop planarizing the first surface 213. If the surface roughness is out of the specified range, continue planarizing the first surface 213 until the surface roughness of the first surface 213 is within the specified range.

In step 103, an oxide layer 224 and a second reflector 28 are sequentially formed on the second semiconductor layer 27.

In this embodiment, as shown in FIG. 4, the oxide layer 224 includes a light transmitting region 2241 and a light shielding region 2242, and the light shielding region 2242 surrounds the light transmitting region 2241. The light emitted by the vertical cavity surface emitting laser can be emitted from the light transmitting region 2241, but cannot be emitted from the light shielding region 2242, which can reduce the width of the beam.

In this embodiment, as shown in FIG. 4, the second reflector 28 is formed on the oxide layer 224 via an epitaxial process, to form a cavity resonator with the first reflector 23. The structure of the second reflector 28 is similar to that of the first reflector 23, both of which are Bragg reflectors. The second reflector 28 is also formed of high refractive index materials and low refractive index materials, in which these two kinds of materials are alternately arranged. For example, the second reflector 28 includes $SiO_2$ and $TiO_2$ which are alternately disposed in a plurality of layers.

In this embodiment, due to the planarization for the first surface 213 of the second semiconductor material layer 26 away from the substrate 21, the second contact surface 214 of the second semiconductor layer 27 in contact with the second reflector 28 is flat, and the surface of the second reflector 28 facing the first reflector 23 is flat. In this way, the problem of different cavity lengths of the cavity resonator at different locations can be alleviated, that is, the uniformity of cavity length of the cavity resonator is improved. Besides, the uniformity of the thickness of the epitaxial layers between the second reflector 28 and the first reflector 23 is improved, thereby improving the uniformity of light emitted from the vertical cavity surface emitting laser. In addition, in the solution of the present disclosure, due to the uniform cavity length of the cavity resonator, only the light with a specific wavelength can be allowed to be emitted. Compared to the solution of improving the uniformity of cavity length of the cavity resonator at various locations by sensitive elements in the active layer that affect the wavelength of the emitted light, such as In element, the solution provided by the present disclosure is more simple and the cost is low.

Figure 5:
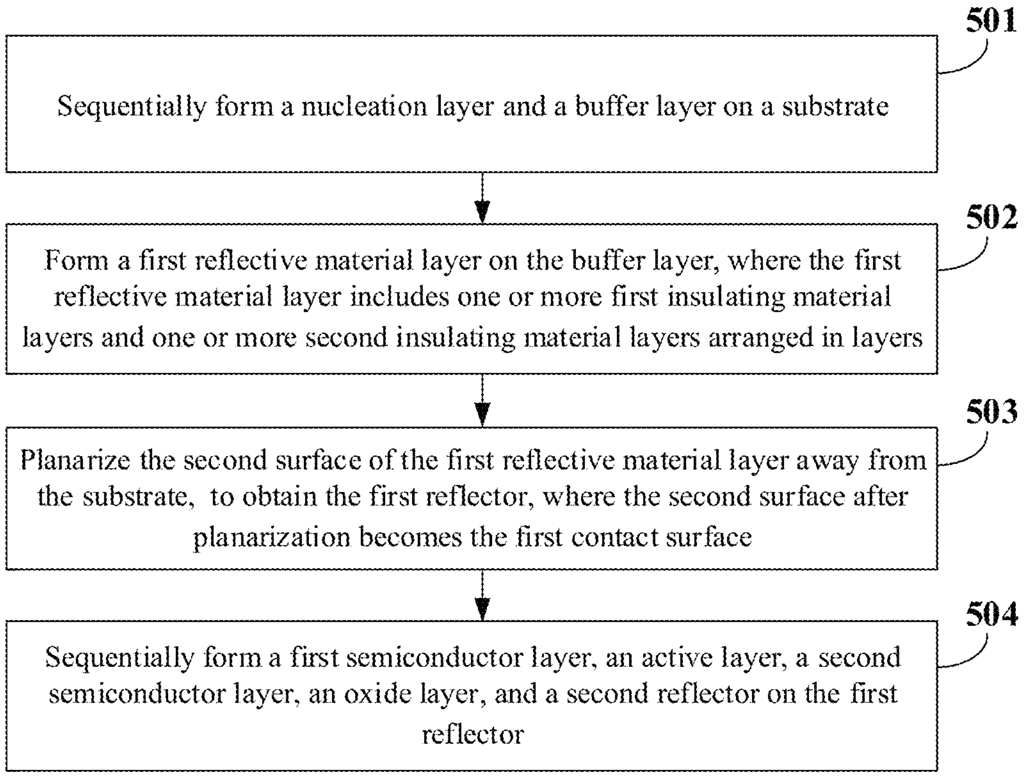
FIG. 5 is a flowchart of a method of manufacturing a vertical cavity surface emitting laser according to a second embodiment of the present disclosure.
Figure 6:
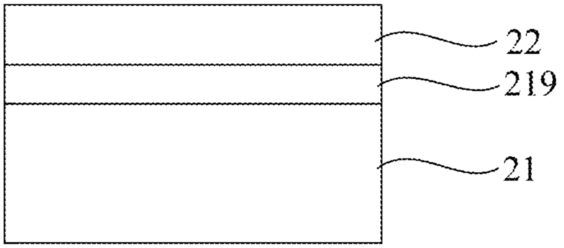
FIGS. 6 to 8 are schematic views illustrating intermediate structures corresponding to the process of FIG. 5.
Figure 7:
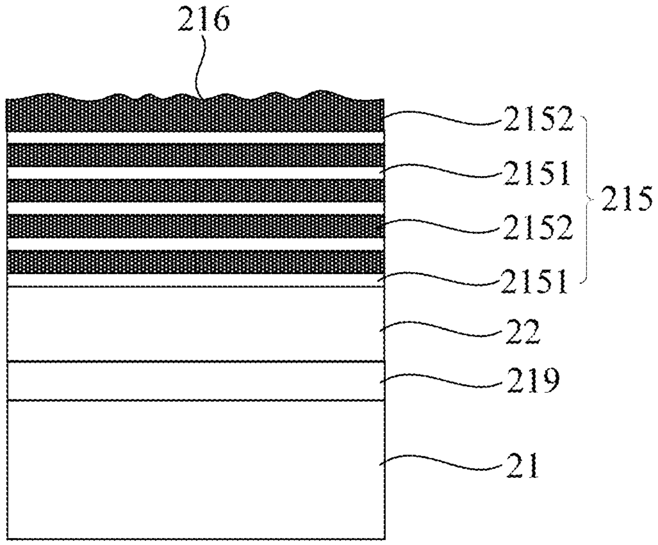
Figure 8:
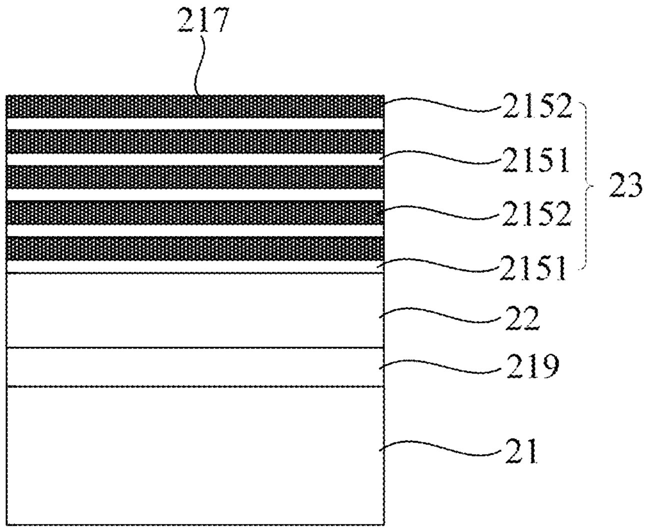
Figure 9:
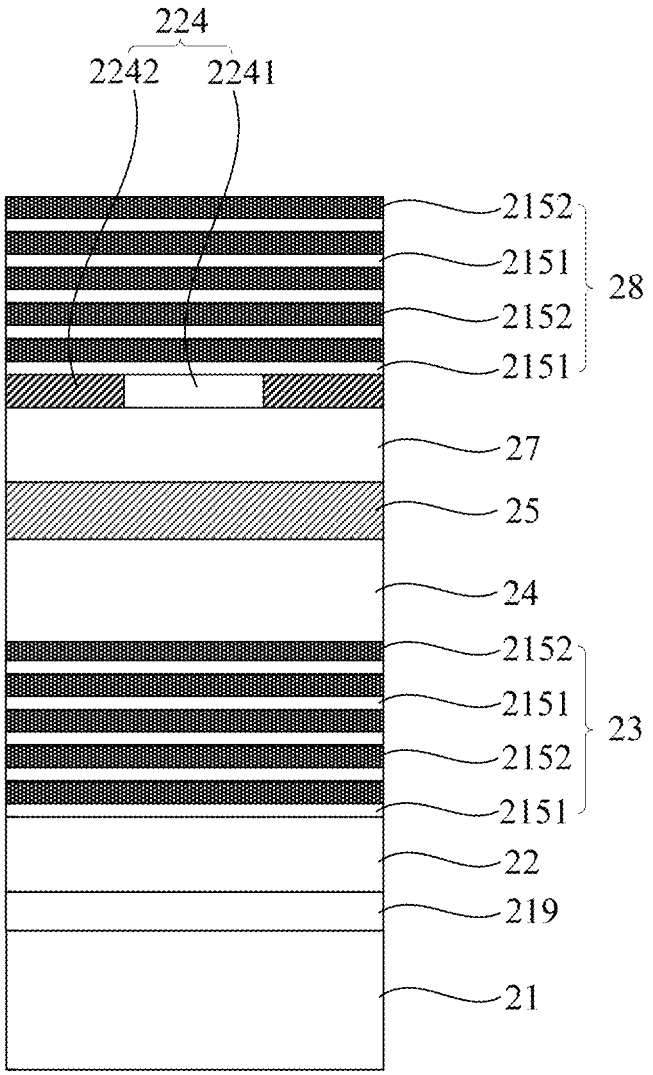
FIG. 9 is a cross-sectional structure diagram of the vertical cavity surface emitting laser according to the second embodiment of the present disclosure.

FIG. 5 is a flowchart of a method of manufacturing a vertical cavity surface emitting laser according to a second embodiment of the present disclosure. FIGS. 6 to 8 are schematic views illustrating intermediate structures corresponding to the process of FIG. 5. FIG. 9 is a cross-sectional structure diagram of the vertical cavity surface emitting laser according to the second embodiment of the present disclosure. As shown in FIG. 5, in this embodiment, the manufacturing method of the vertical cavity surface emitting laser includes the following steps 501 to 504.

In step 501, a nucleation layer 219 and a buffer layer 22 are sequentially formed on the substrate 21.

In this step, as shown in FIG. 6, the nucleation layer 219 and the buffer layer 22 are sequentially formed on the substrate 21 via an epitaxial process.

In this embodiment, the material of the substrate 21 can be gallium nitride, silicon, silicon carbide, or sapphire.

In this embodiment, the material of the nucleation layer 219 can be GaN, or can be AlN, AlGaN, InGaN, or AlInGaN.

In this embodiment, the material of the buffer layer 22 can be AlGaN, or can be GaN, AlN, InGaN, or AlInGaN.

In step 502, a first reflective material layer 215 is formed on the buffer layer 22, where the first reflective material layer 215 includes one or more first insulating material layers 2151 and one or more second insulating material layers 2152 arranged in layers.

In this step, as shown in FIG. 7, the first reflective material layer 215 is formed on the buffer layer 22 via an epitaxial process, where the first reflective material layer 215 includes the first insulating material layers 2151 and the second insulating material layers 2152 arranged alternately in multiple layers. The material of the first insulating material layer 2151 can be $TiO_2$, and the material of the second insulating material layer 2152 can be $SiO_2$, which is not limited here.

It should be noted that, as shown in FIG. 7, the second surface 216 of the first reflective material layer 215 away from the substrate 21 may be uneven, which may lead to different cavity lengths of the cavity resonator at different locations, that is, uniformity of the cavity length of the cavity resonator is poor. Moreover, if the first semiconductor layer 24 is directly grown on the second surface 216, then the surface of the first semiconductor layer 24 facing the first reflective reflector 23 may be uneven, resulting in a poor uniformity of the thickness of the epitaxial layers between the second reflector 28 and the first reflector 23, which lead to poor uniformity of the light emitted from the vertical cavity surface emitting laser.

In step 503, the second surface 216 of the first reflective material layer 215 away from the substrate 21 is planarized to obtain the first reflector 23, where the second surface 216 after planarization becomes the first contact surface 217.

In this step, as shown in FIG. 8, the first reflector 23 can be obtained by planarizing the second surface 216 of the first reflective material layer 215 away from the substrate 21 via a dry etching process, a wet etching process, or a mechanical polishing process. The second surface 216 is planarized to form a flat first contact surface 217.

In this embodiment, during the process of planarizing the second surface 216, whether the surface roughness of the second surface 216 is within the specified range or not is detected. If the surface roughness is within the specified range, stop planarizing the second surface 216. If the surface roughness is out of the specified range, continue planarizing the second surface 216 until the surface roughness of the second surface 216 is within the specified range.

In step 504, a first semiconductor layer 24, an active layer 25, a second semiconductor layer 27, an oxide layer 224, and a second reflector 28 are sequentially formed on the first reflector 23.

In this step, as shown in FIG. 9, the first semiconductor layer 24, the active layer 25, the second semiconductor layer 27, the oxide layer 224, and the second reflector 28 are sequentially formed on the first reflector 23 via an epitaxial process.

In this embodiment, the first semiconductor layer 24, the active layer 25, the second semiconductor layer 27, and the oxide layer 224 are similar to the first semiconductor layer 24, the active layer 25, the second semiconductor layer 27, and the oxide layer 224 in the first embodiment, and will not be described here.

In this embodiment, as shown in FIG. 9, the structure of the second reflector 28 is similar to that of the first reflector 23, both of which are Bragg reflectors, including $SiO_2$ and $TiO_2$ which are alternately arranged in a plurality of layers.

In this embodiment, due to the planarization of the second surface 216 of the second semiconductor material layer 215 away from the substrate 21, the second contact surface 217 of the second semiconductor layer 23 in contact with the second reflector 28 is flat, and the surface of the second reflector 28 facing the first reflector 23 is flat. In this way, the problem of different cavity lengths of the cavity resonator at different locations can be alleviated, that is, the cavity length uniformity of the cavity resonator is improved. Besides, the uniformity of the thickness of the epitaxial layers between the second reflector 28 and the first reflector 23 is improved, thereby improving the uniformity of light emitted from the vertical cavity surface emitting laser. In addition, in the solution of the present disclosure, due to the uniform cavity length of the cavity resonator, only the light with a specific wavelength can be allowed to be emitted. Compared to the solution of improving the uniformity of cavity length of the cavity resonator at various locations by sensitive elements in the active layer that affect the wavelength of the emitted light, such as In elements, the solution provided by the present disclosure is more simple and the cost is low.

It should be noted that the first embodiment and the second embodiment can be used in combination to make the surface of the first reflector 23 facing the second reflector 28 is flat, while the surface of the second reflector 28 facing the first reflector 23 is also flat. In this way, the cavity length uniformity of the cavity resonator can be further improved, and the thickness uniformity of the epitaxial layers between the second reflector 28 and the first reflector 23 is better, which can further improve the uniformity of light emitted from the vertical cavity surface emitting laser.

Figure 10:
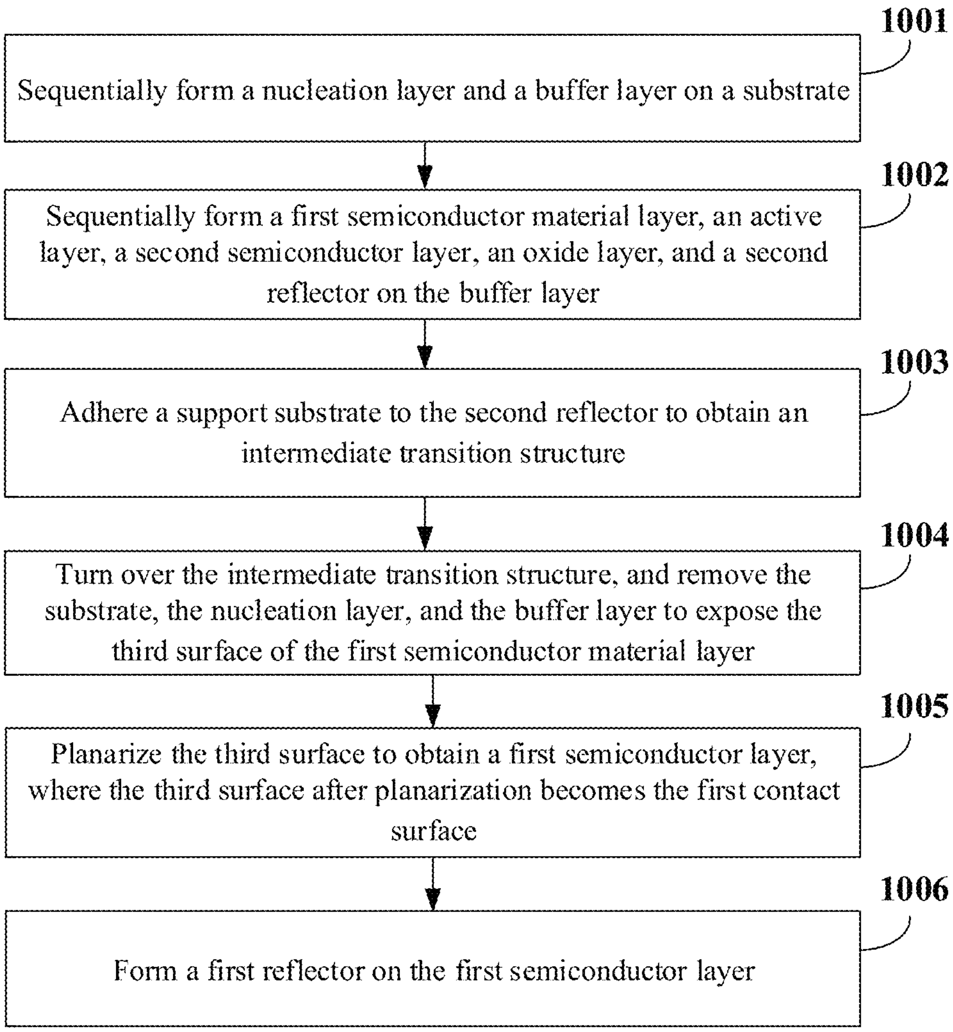
FIG. 10 is a flowchart of a method of manufacturing a vertical cavity surface emitting laser according to a third embodiment of the present disclosure.

FIG. 10 is a flowchart of a method of manufacturing a vertical cavity surface emitting laser according to a third embodiment of the present disclosure. FIGS. 11 to 15 are schematic views illustrating intermediate structures corresponding to the process of FIG. 10. FIG. 16 is a cross-sectional structure diagram of the vertical cavity surface emitting laser according to the third embodiment of the present disclosure. In the embodiment, the manufacturing method of the vertical cavity surface emitting laser includes the following steps 1001 to 1006.

In step 1001, a nucleation layer 219 and a buffer layer 22 are sequentially formed on the substrate 21.

Figure 11:
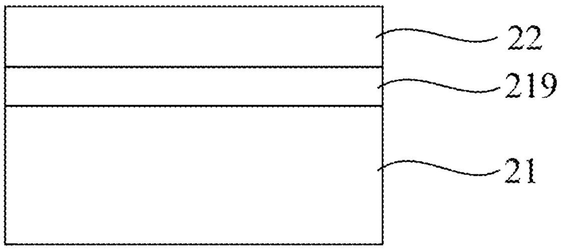
FIGS. 11 to 15 are schematic views illustrating intermediate structures corresponding to the process of FIG. 10.

In this step, as shown in FIG. 11, the nucleation layer 219 and the buffer layer 22 are sequentially formed on the substrate 21 via an epitaxial process.

In this embodiment, the material of the substrate 21 can be sapphire, silicon, silicon carbide, or gallium nitride.

In this embodiment, the material of the nucleation layer 219 can be InGaN, or can be GaN, AlN, AlGaN, or AlInGaN.

In this embodiment, the material of the buffer layer 22 can be InGaN, or can be GaN, AlN, AlGaN, or AlInGaN.

In step 1002, a first semiconductor material layer 29, an active layer 25, a second semiconductor layer 27, an oxide layer 224, and a second reflector 28 are sequentially formed on the buffer layer 22.

Figure 12:
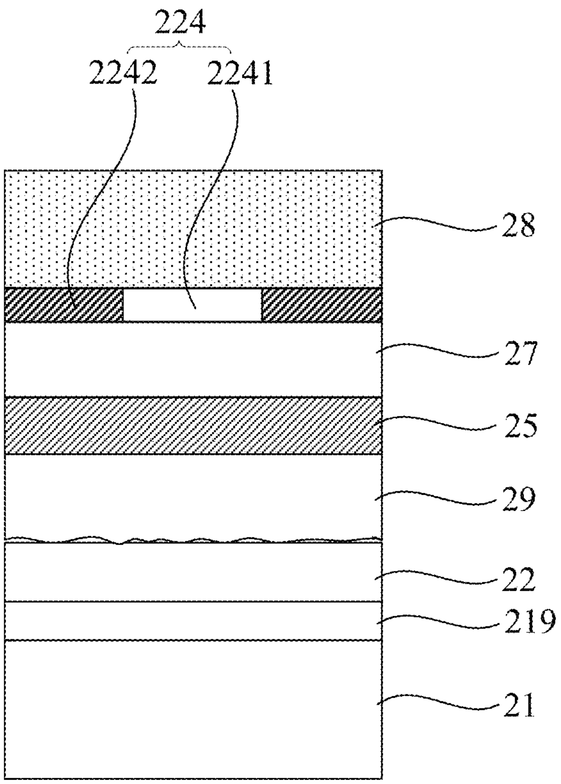

In this embodiment, as shown in FIG. 12, the first semiconductor material layer 29, the active layer 25, the second semiconductor layer 27, the oxide layer 224, and the second reflector 28 are sequentially formed on the buffer layer 22 via an epitaxial process.

In this embodiment, the first semiconductor material layer 29 is an N-type semiconductor layer. The material of the first semiconductor material layer 29 is a group III-V compound, such as GaN, AlN, AlGaN, InGaN, or AlInGaN. The doping elements of the first semiconductor material layer 29 include at least one kind of Si ions, Ge ions, Sn ions, Se ions, or Te ions. For example, the doping elements of the first semiconductor material layer 29 include Si ions, or include Si ions and Ge ions, which is not limited herein.

In this embodiment, as shown in FIG. 12, the second surface 216 of the first semiconductor material layer 29 facing the buffer layer 22 may be uneven, which may cause the thickness uniformity of the epitaxial layers between the second reflector 28 and the first reflector 23 to be poor, further resulting in poor uniformity of the light emitted from the vertical cavity surface emitting laser.

In step 1003, a support substrate 211 is adhered to the second reflector 28 to obtain an intermediate transition structure 212.

Figure 13:
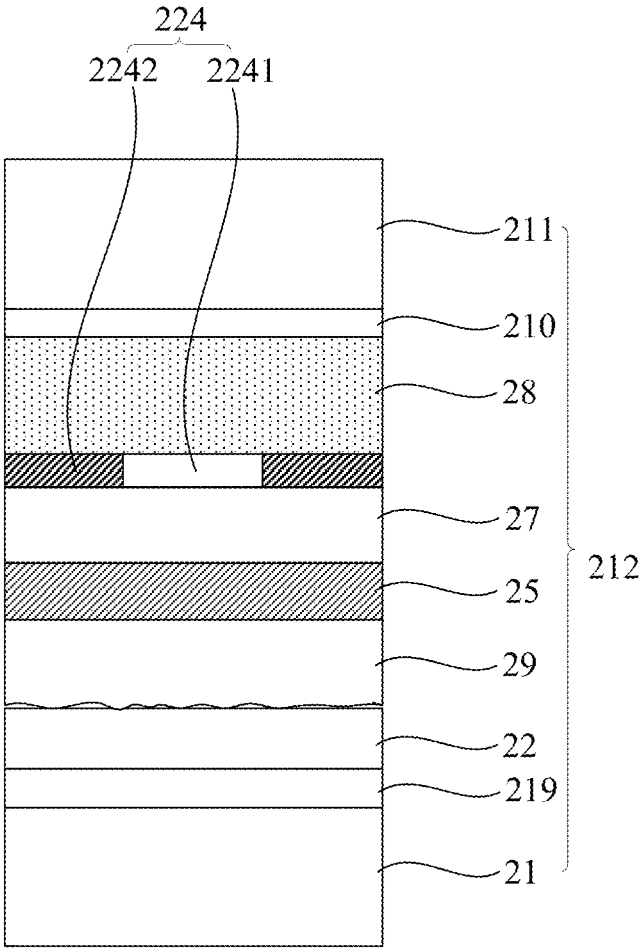

In this embodiment, as shown in FIG. 13, an adhesive layer 210 can be used to adhere the support substrate 211 to the second reflector 28 to obtain an intermediate transition structure 212. The adhesive layer 210 and the support substrate 211 can be made of insulating materials. The material of the support substrate 211 may be silicon. Of course, the material of the substrate 21 can also be silicon carbide, gallium nitride, or sapphire.

In step 1004, the intermediate transition structure 212 is turned over, and the substrate 21, the nucleation layer 219, and the buffer layer 22 are removed to expose the third surface 218 of the first semiconductor material layer 29.

Figure 14:
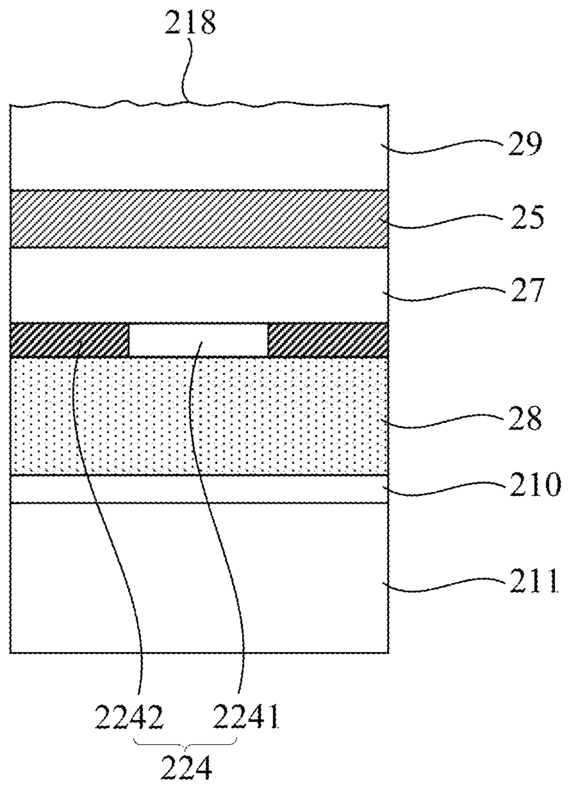

In this embodiment, as shown in FIG. 14, the intermediate transition structure 212 is turned over, and the substrate 21, nucleation layer 219, and buffer layer 22 are removed, to expose the third surface 218 of the first semiconductor material layer 29 to facilitate planarization.

In step 1005, the third surface 218 is planarized to obtain a first semiconductor layer 24, and the third surface 218 after planarization becomes the first contact surface 217.

Figure 15:
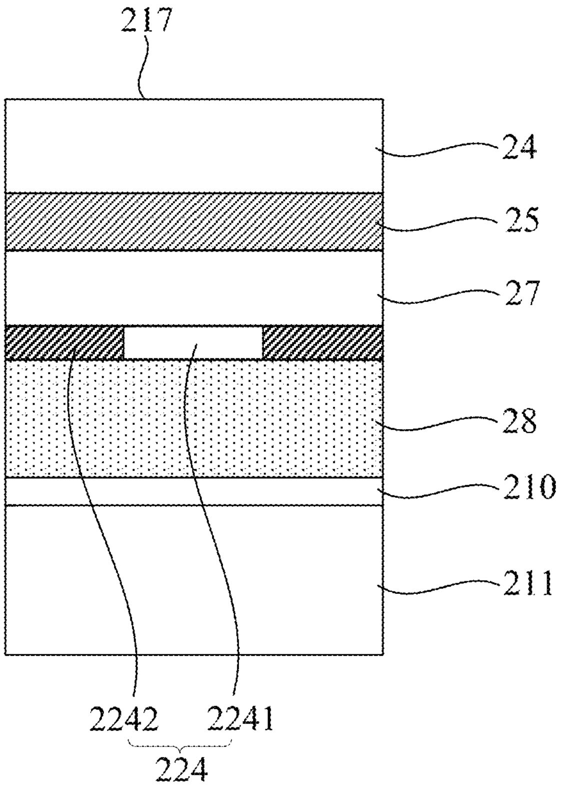
Figure 16:
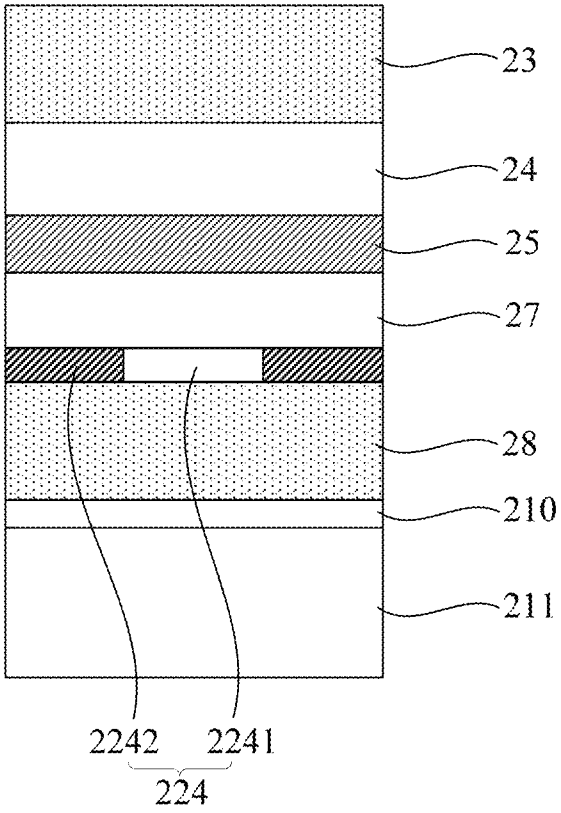
FIG. 16 is a cross-sectional structure diagram of the vertical cavity surface emitting laser according to the third embodiment of the present disclosure.

In this embodiment, as shown in FIG. 15, the third surface 218 can be planarized via a dry etching process, a wet etching process, or a mechanical polishing process to obtain the first semiconductor layer 24. The third surface 218 is planarized to form a flat first contact surface 217.

In this embodiment, during the process of planarizing the third surface 218, whether the surface roughness of the third surface 218 is within the specified range or not is detected. If the surface roughness is within the specified range, stop planarizing the third surface 218. If the surface roughness is out of the specified range, continue planarizing the third surface 218 until the surface roughness of the third surface 218 is within the specified range.

In step 1006, a first reflector 23 is formed on the first semiconductor layer 24.

In this embodiment, as shown in FIG. 16, the first reflector 23 is formed on the first semiconductor layer 24 via an epitaxial process.

In this embodiment, due to the planarization of the third surface 218 of the first semiconductor material layer 29, the first contact surface 217 of the first semiconductor layer 24 in contact with the first reflector 23 is flat, and thus the thickness uniformity of the first semiconductor layer 24 is improved, thereby improving the thickness uniformity of the epitaxial layers between the second reflector 28 and the first reflector 23, which improves the uniformity of light emitted from the vertical cavity surface emitting laser. In addition, in the solution of the present disclosure, due to the uniform cavity length of the cavity resonator, only the light with a specific wavelength can be allowed to be emitted. Compared to the solution of improving the uniformity of cavity length of the cavity resonator at various locations by sensitive elements in the active layer that affect the wavelength of the emitted light, such as In elements, the solution provided by the present disclosure is more simple and the cost is low.

Figure 17:
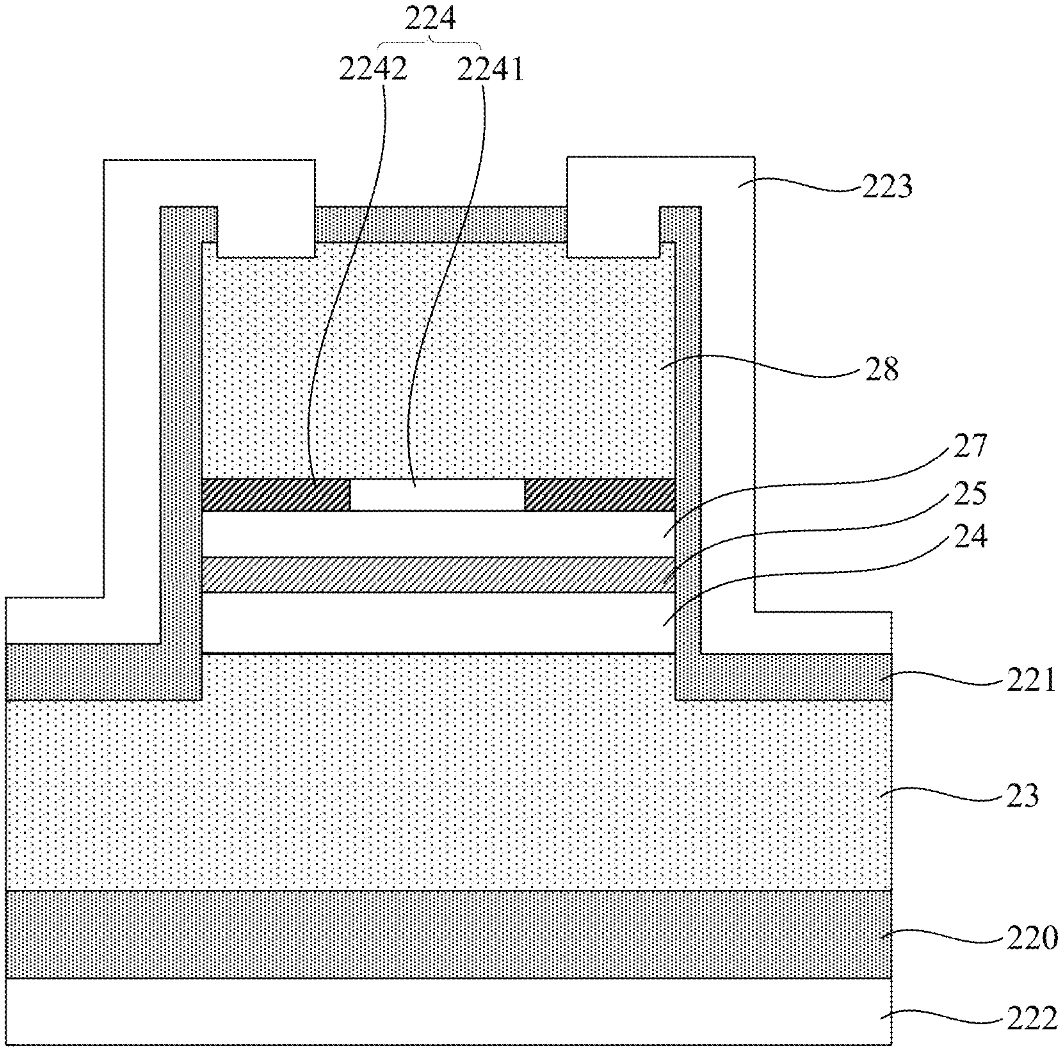
FIG. 17 is a cross-sectional structure diagram of a vertical cavity surface emitting laser according to a fourth embodiment of the present disclosure.

FIG. 17 is a cross-sectional structure diagram of the vertical cavity surface emitting laser according to a fourth embodiment of the present disclosure. In this embodiment, as shown in FIG. 17, a vertical cavity surface emitting laser (VCSEL) includes a first electrode 222, a third insulating material layer 220, a first reflector 23, a first semiconductor layer 24, an active layer 25, a second semiconductor layer 27, an oxide layer 224, a second reflector 28, a fourth insulating material layer 221, and a second electrode 223 that are sequentially stacked.

In this embodiment, as shown in FIG. 17, the oxide layer 224 includes a light transmitting region 2241 and a light shielding region 2242, and the light shielding region 2242 surrounds the light transmitting region 2241. The light emitted by the vertical cavity surface emitting laser can be emitted from the light transmitting region 2241, but cannot be emitted from the light shielding region 2242, which can reduce the width of the beam.

In this embodiment, as shown in FIG. 17, the second electrode 223 is in contact with the second reflector 28 through a through hole in the fourth insulating material layer 221.

In this embodiment, the first reflector 23, the first semiconductor layer 24, the active layer 25, the second semiconductor layer 27, the oxide layer 224, and the second reflector 28 that are sequentially stacked can be manufactured via the manufacturing method of the vertical cavity surface emitting laser described in any of the above embodiments.

Compared to the prior art, the beneficial effect of the present disclosure is that because the first contact surface of the first semiconductor layer and the first reflector, and/or the second contact surface of the second semiconductor layer and the second reflector, are planarized, the uniformity of the spacing between the first reflector and the second reflector can be improved, that is, the uniformity of the cavity length of the cavity resonator formed by the first reflector and the second reflector can be improved, which can improve the uniformity of light emitted from the vertical cavity surface emitting laser. In addition, in the solution of the present disclosure, due to the uniform cavity length of the cavity resonator, only the light with a specific wavelength can be allowed to be emitted. Compared to the solution of improving the uniformity of cavity length of the cavity resonator at various locations by sensitive elements in the active layer that affect the wavelength of the emitted light, such as In elements, the solution provided by the present disclosure is more simple and the cost is low.

Although the present disclosure discloses the above contents, the present disclosure is not limited thereto. One of ordinary skill in the art can make various variants and modifications to the present disclosure without departing from the spirit and scope of the present disclosure. Therefore, the protection scope of the present disclosure should be set forth by the appended claims.

The invention claimed is:

1. A manufacturing method of a vertical cavity surface emitting laser, wherein the vertical cavity surface emitting laser comprises a first reflector, a first semiconductor layer, an active layer, a second semiconductor layer, an oxide layer, and a second reflector sequentially stacked;

wherein a conductivity type of the first semiconductor layer is opposite to a conductivity type of the second semiconductor layer; the oxide layer comprises a light transmitting region and a light shielding region, and the light shielding region surrounds the light transmitting region;

the manufacturing method comprises:

sequentially forming the first reflector, the first semiconductor layer, the active layer, and a second semiconductor material layer on a substrate; and planarizing a first surface of the second semiconductor material layer away from the substrate to obtain the second semiconductor layer, wherein the first surface after planarization becomes a second contact surface between the second semiconductor layer and the second reflector;

wherein a material of the second semiconductor layer comprises a group III-V compound; and wherein each cavity length at each position of a cavity resonator between the first reflector and the second reflector is the same.

2. The manufacturing method of the vertical cavity surface emitting laser according to claim 1, wherein before sequentially forming the first reflector, the first semiconductor layer, the active layer, and the second semiconductor material layer on the substrate, the method further comprises:

sequentially forming a nucleation layer and a buffer layer on the substrate.

3. The manufacturing method of the vertical cavity surface emitting laser according to claim 1, wherein after planarizing the first surface of the second semiconductor material layer away from the substrate to obtain the second semiconductor layer, the method further comprises:

sequentially forming the oxide layer and the second reflector on the second semiconductor layer.

4. The manufacturing method of the vertical cavity surface emitting laser according to claim 1, wherein forming the first reflector comprises:

forming a first reflective material layer on a substrate, wherein the first reflective material layer comprising one or more first insulating material layers and one or more second insulating material layers arranged in layers; and planarizing a second surface of the first reflective material layer away from the substrate to obtain the first reflector, wherein the second surface after planarization becomes a first contact surface.

5. The manufacturing method of the vertical cavity surface emitting laser according to claim 4, wherein the first reflective material layer comprises first insulating material layers and second insulating material layers which are alternately arranged;

before forming the first reflective material layer on the substrate, the method further comprises:

sequentially forming a nucleation layer and a buffer layer on the substrate.

6. The manufacturing method of the vertical cavity surface emitting laser according to claim 1, wherein the first semiconductor layer is an N-type semiconductor layer; the second semiconductor layer is a P-type semiconductor layer; and the active layer comprises a multiple quantum well structure.

7. The manufacturing method of the vertical cavity surface emitting laser according to claim 6, wherein, the multiple quantum well structure is a periodic structure in which GaN and AlGaN are alternately arranged, or a periodic structure in which GaN and AlInGaN are alternately arranged.

8. The manufacturing method of the vertical cavity surface emitting laser according to claim 1, wherein a material of the first semiconductor layer comprises a group III-V compound.

9. The manufacturing method of the vertical cavity surface emitting laser according to claim 1, wherein the vertical cavity surface emitting laser further comprises a third insulating material layer, a fourth insulating material layer, a first electrode, and a second electrode, wherein the third insulating material layer is located on a side of the first reflector away from the second reflector, and the first electrode is located on a side of the third insulating material layer away from the first reflector;

the fourth insulating material layer is located on a side of the second reflector away from the first reflector, and the second electrode is located on the side of the fourth insulating material layer away from the second reflector; and the second electrode contacts the second reflector through a through hole in the fourth insulating material layer.

10. The manufacturing method of the vertical cavity surface emitting laser according to claim 1, further comprising:

when a first contact surface between the first semiconductor layer and the first reflector is planarized, during the process of planarizing the first contact surface, detecting whether a surface roughness of the first contact surface is within a specified range or not; if the surface roughness of the first contact surface is within the specified range, stopping planarizing the first contact surface; if the surface roughness of the first contact surface is out of the specified range, continuing planarizing the first contact surface until the surface roughness of the first contact surface is within the specified range;

when the second contact surface is planarized, during the process of planarizing the second contact surface, detecting whether a surface roughness of the second contact surface is within the specified range or not; if the surface roughness of the second contact surface is within the specified range, stopping planarizing the second contact surface; if the surface roughness of the second contact surface is out of the specified range, continuing planarizing the second contact surface until the surface roughness of the second contact surface is within the specified range.

* * * * *